United States Patent [19]
Lovett et al.

[11] Patent Number: 5,936,973
[45] Date of Patent: Aug. 10, 1999

[54] TEST MODE LATCHING SCHEME

[75] Inventors: Simon John Lovett, Cupertino; A. Majid Farmanfarmaian, San Carlos; Sammy Siu Yat Cheung, Pleasanton; Mark William Rouse, Santa Clara, all of Calif.

[73] Assignee: Cypress Semiconductor Corp., San Jose, Calif.

[21] Appl. No.: 08/774,293

[22] Filed: Dec. 23, 1996

[51] Int. Cl.⁶ .................................................. G11C 29/00
[52] U.S. Cl. ...................................... 371/21.1; 371/22.36
[58] Field of Search .............................. 371/21.1, 22.36; 365/201, 189.07

[56] References Cited

U.S. PATENT DOCUMENTS

| | | | |
|---|---|---|---|
| 4,910,734 | 3/1990 | Segawa et al. | 371/22.3 |
| 4,913,557 | 4/1990 | Segawa et al. | 371/22.3 |
| 5,079,666 | 1/1992 | Najm | 361/85 |
| 5,369,311 | 11/1994 | Wang et al. | 327/292 |
| 5,388,265 | 2/1995 | Volk | 395/750 |
| 5,434,819 | 7/1995 | Matsuo et al. | 365/189 |
| 5,502,689 | 3/1996 | Peterson et al. | 368/156 |

OTHER PUBLICATIONS

Cypress Semiconductor Corp., Cypress Data Book CD–ROM Summer 1996, CY2291/CY2292, pp. 1–7, Jun. 1994—Revised Sep. 1995.

Cypress Semiconductor Corp., Cypress Data Book CD–ROM, Summer 1996 CY7C42X/46X FIFO Interface to the CY7B923 (HOTLink™), pp. 6–326 to 6–328.

Cypress Semiconductor Corp., Cypress Data Book CD–ROM Summer 1996, CY7B923/CY7B933, pp. 1–28, Dec. 1991–Revised Aug. 1994.

Cypress Semiconductor Corp., Cypress Data Book CD–ROM Summer 1996, CY7B991/CY7B992, pp. 1–13.

Cypress Semiconductor Corp., Cypress Data Book CD–ROM Summer 1996, CY7B9910/CY7B9920, pp. 1–7, Nov. 1994 —Revised Feb. 1996.

Cypress Semiconductor Corp., Cypress Data Book CD–ROM Summer 1996, CY27H512, pp. 1–11, Jun. 1994—Revised Oct. 1995.

"An 80–ns 1–Mb Flash Memory with On–Chip Erase/Erase Verify Controller," Seki et al., IEEE Journal of Solid–State Circuits, vol. 25, No. 5, pp. 1147–1151, Oct. 1990.

Cypress Semiconductor Corp., http:// www.cypress.com, ICD2093, pp. 1–2, Mar. 1995.

*Primary Examiner*—Phung M. Chung
*Attorney, Agent, or Firm*—Maiorana & Acosta, P.C.

[57] ABSTRACT

A novel synchronous latching scheme is disclosed for use in connection with an EPROM device having a limited number of pins for control signals. A negative edge-triggered d-type master-slave latch having a D-input, and a clock input is provided for generating a program/verify read mode signal. The D-input is coupled to a $V_{pp}/\overline{OE}$ control terminal of the EPROM, while the clock input is coupled to a $\overline{CE/PGM}$ control terminal. During a program interval, while an enabled memory cell is being programmed, and the $V_{pp}$ control terminal is at a supervoltage, the latch is operable to capture the high level on such control terminal, and provide the high level as an output to define a verify read mode signal. During an immediately-following program verify read interval, the asserted verify mode signal is used to adjust the sense amplifier of the EPROM device so as to provide an increased read margin. During such verify program interval, the $V_{pp}/\overline{OE}$ control terminal goes low to enable the outputs of the EPROM device. Such low signal is captured by the latch during the verify interval using the $\overline{CE/PGM}$ signal as a clock, such that the verify mode signal is driven low. With the verify mode signal in a logic low state, subsequent read operations of the EPROM chip occur as standard reads, since the sense amplifiers associated with the memory array of the EPROM device employ a standard reference signal, not the verify reference signal designed to add read margin.

20 Claims, 3 Drawing Sheets

TEST MODE LATCHING SCHEME

BACKGROUND OF THE INVENTION

1. Field of the Invention

The present invention relates generally to a system for enabling a test mode in a device, and, more particularly, to a method and apparatus for enabling a program verify mode in an erasable programmable read-only memory (EPROM).

2. Description of the Related Art

The need for a special test mode in a semiconductor device has manifested itself in a variety of different ways. In particular, a memory device, such as an EPROM, has a program verify mode to determine whether a program operation has been successfully performed. Those of ordinary skill in the art will recognize that an apparatus known as an EPROM programmer may be used to perform the programming, and verify operations. The EPROM programmer conventionally applies a selected address to the EPROM, further applies the user-specified data to be written at that address, and then, to perform the actual programming operation, asserts predetermined control signals, and applies a programming "pulse". The programmed EPROM bit is then read (i.e., "verified") to ensure that it was programmed correctly. Were the bit found to be incorrectly programmed, then the EPROM programming machine may be controlled in some circumstances to apply a second (and further) programming pulse to the same address in an effort to program it correctly. This "multi-pulse" programming is often required due either to poor high voltage levels generated by the EPROM programmer, adverse noise conditions, or a weak bit in the EPROM array. In the case of a weak bit (a common fault), the ability to apply multiple "pulses" is very useful, since it allows greater yield and reliability, either when sorting such memory devices after fabrication, or when put into the customer's hands (e.g., when programmed by an EPROM programmer apparatus).

A particular type of verify mode is often provided on EPROMs which adds some margin to the standard read mode. In particular, when an address is read using this special verify mode, it must be over-programmed (i.e., have extra margin) or else the read operation will fail. Thus, this special verify mode ensures that some margin always exists on programmed memory cells. Multi-pulse programming and the above-mentioned special verify mode thus cooperate to improve both the yield and the reliability of the part.

Further, conventional EPROMs generally have control terminals or pins available for a programming voltage ($V_{pp}$), output enable signal ($OE/\overline{OE}$), a programming signal ($PGM/\overline{PGM}$) and a chip enable signal ($CE/\overline{CE}$). One approach taken in providing the above-mentioned special verify mode is asynchronous in nature, and requires a dedicated control pin for implementation. In particular, such an approach requires that a supervoltage (i.e., a higher-than-$V_{cc}$ voltage used for programming), applied to the $V_{pp}$ pin during programming, be maintained while taking the output enable pin low to enter the special verify mode. For a standard read (verify operation), the supervoltage would be otherwise removed from the $V_{pp}$ pin. Thus, with this approach, a dedicated pin (namely, $V_{pp}$) provides the means for distinguishing between a normal or standard read, and the special verify read mode. This approach is satisfactory as long as there are available pins so that the relevant control terminals may be properly asserted.

However, the trend in semiconductor devices has been to reduce the number of pins or terminals per package. In particular, one industry standard pin configuration (JEDEC) for an EPROM is a 28-pin package. This package is pin limited with respect to control signals. In particular, this standard specifies that one pin shall be for $V_{pp}/\overline{OE}$, an another pin will be for $\overline{CE/PGM}$. This particular industry standard further specifies that no pins other than control pins may be used to decode the special verify mode (e.g., an address pin may not be used to decode this mode).

A problem thus arises when attempting to implement the above-mentioned special verify mode in such a pin-limited package. In particular, after a programming operation where $V_{pp}$ is at supervoltage, the verify operation requires that the output enable ($\overline{OE}$) be taken low in order to read the programmed bit. Since the output enable ($\overline{OE}$) and the programming voltage $V_{pp}$ are implemented on the same pin in the JEDEC EPROM standard package, and ($\overline{OE}$) must be taken low to enable the outputs for the read operation, the conventional manner of allowing $V_{pp}$ to remain at supervoltage to decode the special verify read mode is not possible. Since the conventional asynchronous decoding techniques are unavailable in the above-described or similarly pin-limited packages, such a device is unable to distinguish the special verify mode from a standard read mode. Without the special verify mode (i.e., having the extra read margin) the advantages of improved yield and reliability at sort and in customer's hands may not be available in such a device.

Thus, there is a need to provide an improved system for enabling a test mode in a semiconductor device that reduces or eliminates one or more of the problems as described above.

SUMMARY OF THE INVENTION

It is an object of the present invention to provide a semiconductor device that automatically verifies a programming operation, where the device is in a package that has either a limited number of control pins or no dedicated verify/test pin.

The present invention achieves this and other objects. The present invention has the advantages of being extremely economical in terms of added structure and of avoiding a need for additional control or test pins. The present invention also solves one or more of the problems described in the Background above.

A further object of the present invention is to enable a test or verify mode in a circuit, using existing control pins to save freal estate on/in the chip/die containing the circuit.

The present invention concerns a circuit that functions to enable a test mode in a semiconductor de-vice, and includes means for receiving a first signal, means for receiving a second signal, and means for synchronously latching the first signal according to the second signal. The first, latched, signal corresponds to a test mode of operation of the device. In a preferred embodiment, the first and second signals may each be a control signal, and the second signal may function as a clock signal. In a preferred embodiment, the second or clock signal may be derived from a chip enable or program control signal. The synchronous latching means is provided for generating a test mode signal indicative of the test mode of the device. In a preferred embodiment, the test mode is a program verify mode. In a further preferred embodiment, the synchronous latching means may be a negative edge-triggered d-type master-slave latch where a programming voltage/output enable signal is applied to the D-input, and an inverted version of the chip enable/program control signal is applied to the clock input. The Q-output of the latch may thus function as the verify mode signal.

In operating a preferred embodiment, while in a programming mode (where $V_{pp}$ is at a supervoltage), the second control signal (which may be the $\overline{CE/PGM}$ signal) on the pad pulses low, preferably for a predetermined time, to permit programming. In particular, when the second control signal transitions low, a master portion of the latch samples the first control signal (which may be the $V_{pp}/\overline{OE}$ high-trip signal). Upon the rising edge of the second control signal (which may operate as a clock signal), the logic high of the first control signal that was sampled at the master portion of the latch is passed to a slave portion of the latch and is output by the latch as the program verify signal. This test mode signal may then be employed to adjust a sense amplifier or voltage detector portion of the device to provide a suitable and/or predetermined read margin. The first control signal, after programming, goes low, is captured by the latch, then is outputted by the (master-slave) latch upon the next rising edge of the second control signal. The program verify mode signal is now low, and the sense amplifiers or voltage detectors are accordingly configured for normal operation thereafter.

According to the structure described above, the device itself synchronously latches in the test mode, using the control signals on the control terminals as inputs. The output from the synchronous latching means may be fed into a multiplexer to control selection of one of a standard read or verify read reference signal thereafter applied to a sense amplifier or voltage detector. The present invention thus eliminates any need for one or more dedicated control pins to implement a test and/or verify operational mode.

Other objects, features, and advantages of the present invention will become apparent to those skilled in the art from the following detailed description and accompanying drawings illustrating features of this invention by way of example, but not by way of limitation.

DETAILED DESCRIPTION OF THE PREFERRED EMBODIMENTS

Figure 1:
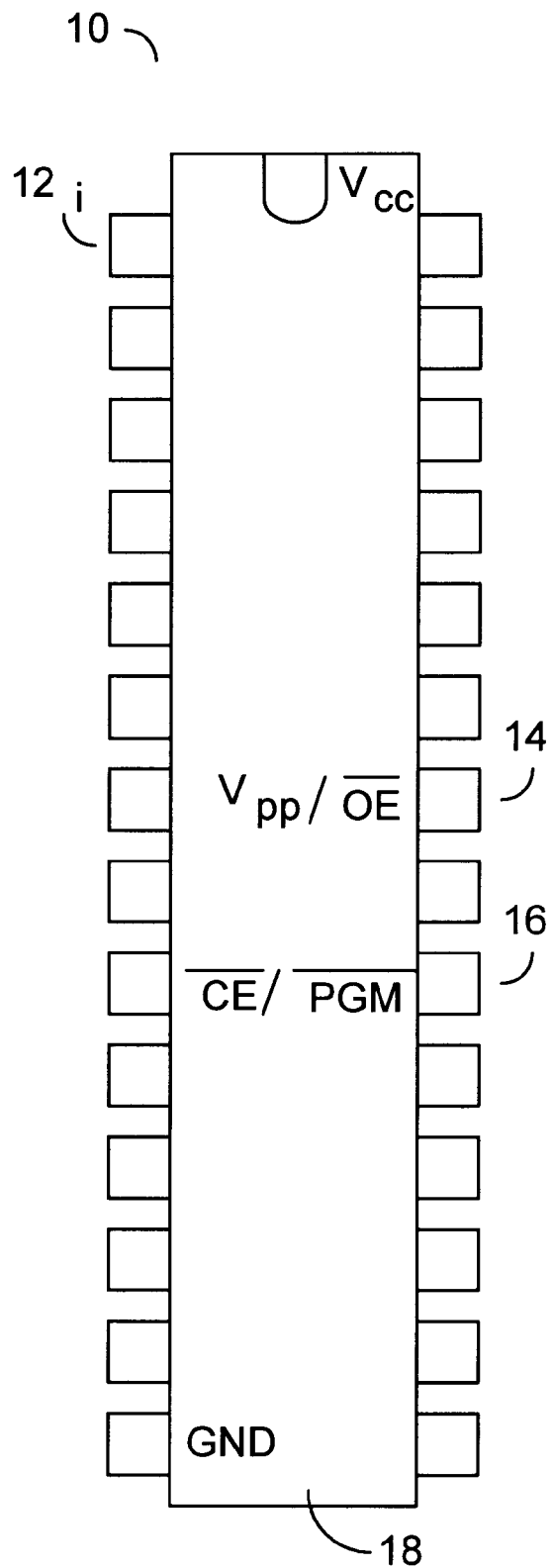
FIG. 1 is a diagrammatic, top view of an exemplary 28-pin package configured for use according to the present invention.

Referring now to the drawings wherein like reference numerals are used to identify identical components in the various views, FIG. 1 shows an exemplary device in which the present invention may be employed, such as an erasable programmable read-only memory (EPROM) 10. However, the present circuit and method can be employed in any integrated circuit (IC) which applies a voltage or excess of normal operating voltage to write or program, then removes or lowers the excess voltage and enters a test mode to verify successful writing/programming. Such IC's include PROMs, $E^2$PROMS, PLDs, CPLDs, FPGAs, ASICs, etc. In a preferred embodiment, the device/IC is a programmable or non-volatile memory (PROM, EPROM, $E^2$PROM, flash), more preferably an EPROM.

Device 10 includes a plurality of terminals or pins $12_i$. In one embodiment, one of the pins $12_i$ is a combined control terminal $V_{pp}/\overline{OE}$ 14 for receiving the $V_{pp}$, and $\overline{OE}$ signals. The $V_{pp}$ and $\overline{OE}$ signals may be received by control terminal 14 in a time multiplexed fashion. Another one of pins $12_i$ is a $\overline{CE/PGM}$ control terminal 16 for receiving the $\overline{CE}$, and $\overline{PGM}$ control signals. The $\overline{CE}$ and $\overline{PGM}$ signals may be received by control terminal 16 in a time multiplexed fashion. In the illustrative embodiment, a semiconductor device 10 is disposed in a 28-pin package 18. However, other packages may comprise, for example, 16, 24, 40, 44, 48, 56, or 108 pins. In addition, the present invention contemplates use of still other pin-configuration packages.

Figure 2:
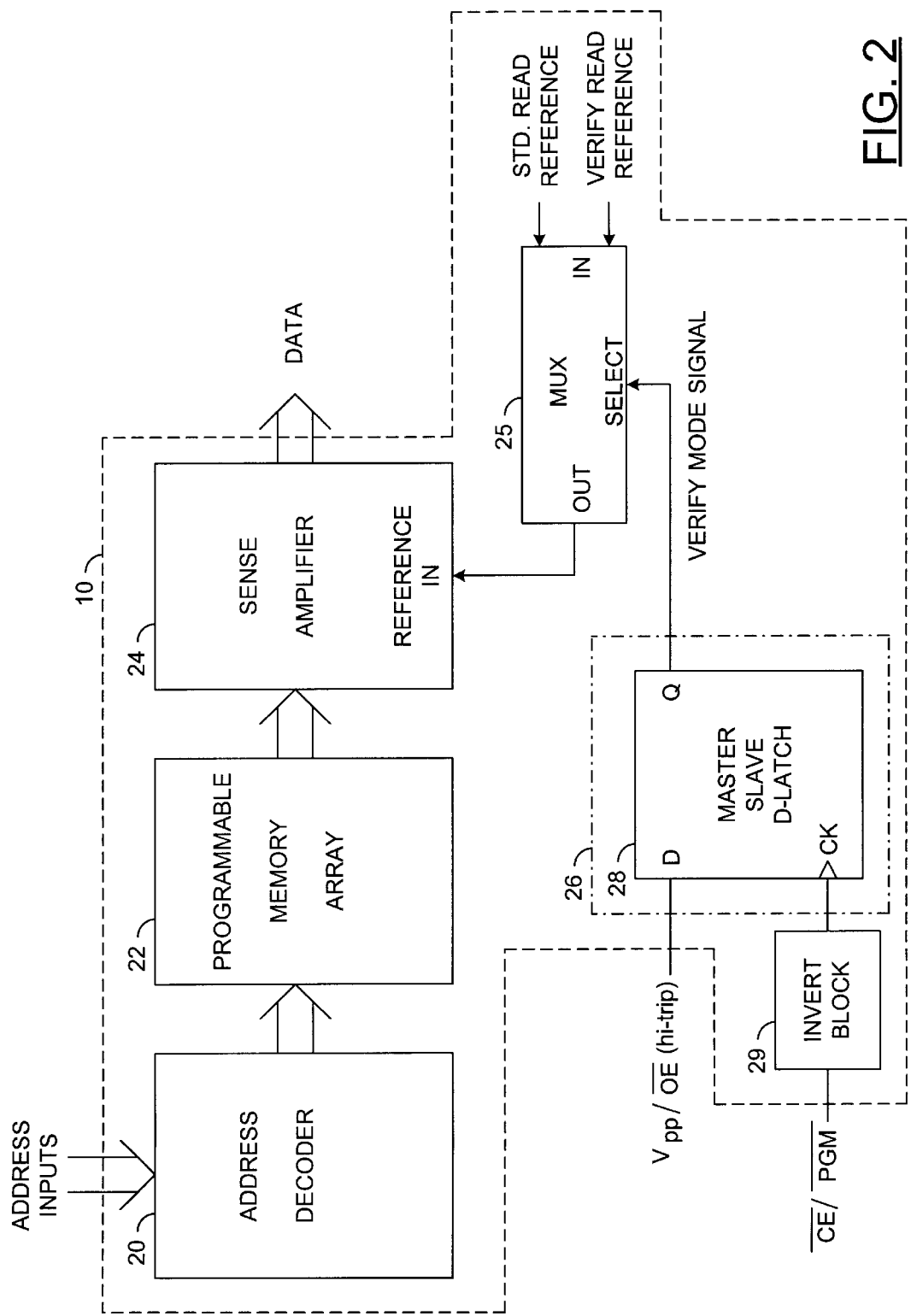
FIG. 2 is a simplified schematic and block diagram view of a circuit for enabling a test or verify mode according to the invention.

FIG. 2 shows some of the functional blocks that may be present in device 10, including the structure of the present invention. Device 10 may comprise an address decoder 20, a programmable (memory) array 22, one or more sense amplifiers 24, means for selecting one of a plurality of signals (such as multiplexer 25), a means or circuit 26 for generating a test mode signal (such as a [negative edge-triggered d-type (master-slave)] latch 28), and means for generating an inverted version of the $\overline{CE/PGM}$ signal (such as inverter block 29). The test mode signal may comprise a program verify mode signal.

Decoder 20, memory array 22, and sense amplifier 24 are all conventional structures, well-known in the art. One of ordinary skill in the art will recognize that there exists a plurality of variations and substitutions for each of portions 20, 22, and 24 of device 10. FIG. 2 shows data flows for a read operation, although it should be understood that array 22 may also be designed for data to be written thereto, as well as being read therefrom. In a preferred embodiment, an address, which may be a multi-bit address word, may be applied to address decoder 20, which in turn, enables reading from or writing to a particular memory cell in array 22. The array 22 is typically arranged in row and column format. Sense amplifier 24 is operative to. exercise, in a known fashion, the enabled memory cell to determine the charge stored in the cell (e.g., whether it is programmed or not), and, further, to generate a data output indicative of the logic state of the cell.

As background, and to illustrate one type of interaction between an enabled memory cell in array 22 and sense amplifier 24, consider a well-known memory structure used in EPROMs; namely, a floating gate structure. The amount of charge programmed onto the floating gate of a memory cell varies the conductivity of the cell. The greater the charge on the floating gate, the lower the conductivity of the cell in response to a standard read voltage being applied to its gate and/or across its source and drain. Such a memory cell may be arranged, as is commonly known, so that when the cell is programmed, little conduction occurs, and when not programmed, a significant amount of conduction occurs. The sense amplifier may be configured to distinguish between conduction levels and to generate an output accordingly. Thus, it should be appreciated that in some instances, a single "pulse" may not deposit enough charge on the floating gate to diminish conductivity to a point where the sense amplifier can detect a "programmed" state, as described above- Thus, further "pulses" may be applied to sufficiently "program" the cell (i.e., deposit charge on the floating gate) so that the sense amplifier can detect the "programmed" state of the memory cell.

Multiplexer 25 may provide a means for increasing read margin and/or for configuring sense amp 24 to provide an increased read margin. Based on the foregoing, and with continued reference to FIG. 2, sense amplifier 24 may have a reference signal applied thereto that is used therein as an input to determine whether an enabled memory cell is "programmed". In a preferred embodiment, such a standard read reference input may have a voltage potential approximately midway between $V_{cc}$ (corresponding to a logic high voltage level) and $V_{ss}$ (corresponding to a logic low state). Adjusting means 25 provides a structure whereby a higher level reference signal, namely, a verify read reference signal, is applied to the sense amplifier to increase the read margin. In a preferred embodiment, the verify read reference signal may be approximately 150 millivolts higher than the standard read reference signal. With the verify reference signal, for example, the conductivity of an enabled memory cell (in one embodiment) must be lower (due to over-programming) than would otherwise be required by the sense amplifier using the standard read reference signal. Therefore, using a verify read reference signal in lieu of the standard reference level may ensure that all of the cells have extra read margin (i.e., stored charge in excess of the nominal threshold value to ensure successful reading of the cell). With extra read margin, noise and the like will not likely produce erroneous results by disrupting the logic state determination made by sense amplifier 24 during normal read operations. A verify programming mode signal, when asserted by latch 28, is used to select the verify read reference for delivery to sense amplifier 24. Otherwise, the standard read reference signal is applied to sense amplifier 24.

Means 26 is provided for generating the program verify mode signal, which corresponds to the program verify mode of operation of device 10. As illustrated in FIG. 2, synchronous latching means 26 may be implemented using negative edge-triggered D-type master-slave latch 28. Latch 28 includes a "D" input connected to the $V_{pp}/\overline{OE}$ control terminal 14 for receiving the $V_{pp}$ and $\overline{OE}$ signals in a time multiplexed fashion via a "HI-TRIP" buffer designed to sense when the high-voltage programming signal vpp is asserted. When a supervoltage is applied to control terminal 14, and is coupled to the D-input of latch 28, such signal is indicative that the program verify mode of operation of device 10 is desired during an immediately-following interval. Latch 28 further includes a clock input CK responsive to an inverted version of the $\overline{CE/PGM}$ control signal from terminal 16 configured to receive the $\overline{CE}$, and $\overline{PGM}$ signals, also in a time multiplexed fashion. These signals are normally high, and are brought low for a predetermined time interval when either a programming operation ($\overline{PGM}$), or a program verify operation or read (standard) operation ($\overline{CE}$) is desired. The transitions observed at control terminal 16 thus define a signal that is operable, in the context of this invention, as a clock signal. Latch 28 is well-known and conventional in the art. A positive-edge triggered latch 28' (not shown) may be substituted for latch 28 and invert block 29, with equivalent operation. Therefore, a variety of variations based on well-known equivalents is fully within the spirit and scope of the present invention.

Figure 3:
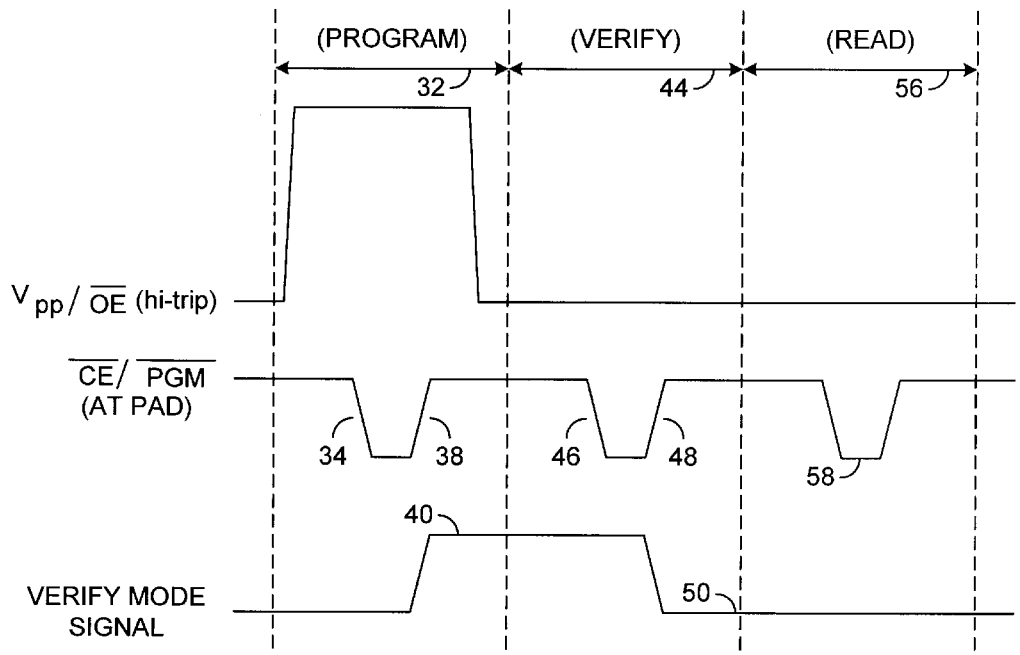
FIG. 3 is a simplified timing chart diagram illustrating the operation of the circuit shown in FIG. 2.
Figure 4:
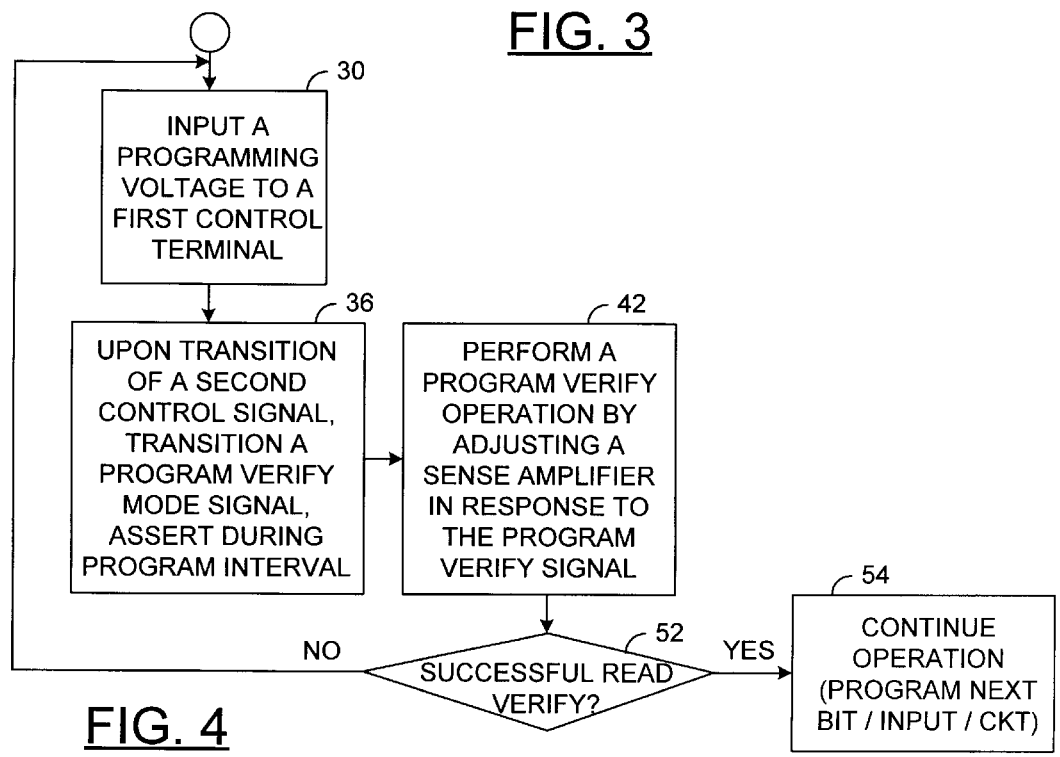
FIG. 4 is a flow-chart diagram illustrating a method of operating the circuit shown in FIG. 2.

Referring now to FIGS. 3 and 4, the operation of a preferred embodiment of the present invention will now be set forth in detail.

In step 30, a programming voltage (i.e., a "supervoltage", which may be higher than the normal chip operating voltage $V_{cc}$ and which is sufficient to program or store charge on a memory cell, or program a logic device) is inputted or applied to the first control terminal 16 of device 10. This action occurs during a programming interval 32, as shown in FIG. 3. While the $\overline{CE/PGM}$ signal is high as applied to the second control terminal 14, a master portion of latch 28 is ready to sample the $V_{pp}/\overline{OE}$ high-trip signal at a high logic state. When the $\overline{CE/PGM}$ signal transitions along negative-edge 34 to a low state, the master portion of latch 28 samples the $V_{pp}/\overline{OE}$ high-trip signal.

Step 36 involves latching a program verify mode signal during program interval 32 by using the $\overline{CE/PGM}$ signal as a clock. This is accomplished on the positive-edge 38 of the $\overline{CE/PGM}$ signal during interval 32, in which the sampled high level held in the master portion of latch 28 is passed to a slave portion of latch 28 and on to the Q-output to thereby assert the program verify mode signal. This high level is shown at 40 in FIG. 3.

Step 42 involves performing a program verify operation, initiated by adding read margin to voltage detector or sense amplifier 24. Adding read margin may be conducted automatically in response to the test or program verify mode signal being input into voltage detectors/sense amplifiers 24. This action occurs during a portion of interval 44 (FIG. 3). Note that during the interval when the verify mode signal is at a logic high state, indicated at 40, the sense amplifier 24 input reference voltage may be adjusted to the verify reference signal, as described above and in accordance with a preferred embodiment of the program verify mode, and/or to add margin to the memory cell read operation. Note that during interval 44, the second control signal (preferably an output enable signal) is a logic low, so the outputs of device 10 are enabled to thereby allow the reading of the programmed memory cell. Also note that at the beginning of interval 44 (with the $\overline{CE/PGM}$ signal now at a logic high state) the master portion of latch 28 is again ready to sample, but this time the $V_{pp}/\overline{CE}$ high-trip signal is low. When the $\overline{CE/PGM}$ signal transitions low along negative-going edge 46, the low signal applied to the master portion of the latch is sampled and held. During the positive-going $\overline{CE/PGM}$ edge 48, the sampled low signal held in the master portion is passed to the slave portion and on to the Q-output of latch 28. The verify mode signal thus assumes a logic low state, indicated at 50. The logic low causes multiplexer 25 to select the standard read reference signal.

Step 52 involves determining, such as by a (memory) programmer or the like, whether the programming step performed during 32 was successful. If not, then the cell or logic circuit may be reprogrammed (for example, using a "multi-pulse" algorithm, such as described in the Background above) to attempt to correct the unsuccessful programming operation. However, if the program verify read was successful, continued operation (such as programming the next cell or circuit to be programmed) occurs, as shown in step 54.

Intervals 32 followed by 44 describe, generally, a program-verify cycle for the particular pin configuration of the preferred embodiment. It is generally the case that intervals 32 and 44 are repeated continuously until all of the array memory cells, for example, have been successfully programmed. Interval 56 occurs thereafter, during the device's normal mode of read operation once programming has been completed and the device has been placed into a system (in the case of EPROM, E²PROM, and FLASH memory, the device may be erased and reprogrammed with different data in the future).

Thus, once the program verify mode signal has assumed a logic low state, shown at 50 (for example, after all the memory cells have been programmed), all further read, write and/or program operations, such as the read that occurs during read interval 56, revert to a standard operational mode. In particular, the level indicated at 58 of the second (e.g. $\overline{CE/PGM}$) control signal may correspond to a normal read operation (mode). The standard mode uses a standard read reference signal which is applied and used by sense amplifier 24 (no extra margin added).

Optionally, power-up circuitry (not shown) may be included on device 10 to ensure that latch 28 powers up in the standard read mode, and not in the test or program verify mode. Such power-up circuitry is conventional and well-known, and its implementation requires no more than routine application of ordinary skill in the art. For example, the latch 28 may be held in reset upon power-up to deassert the program verify mode signal until the power supply has stabilized.

Intervals 32 and 44 in FIG. 3 are JEDEC standard. Hence, the verify scheme of the present invention is fully compatible with existing EPROM programming devices currently available and further performs the verify function transparently to the user (customer), increasing reliability for the customer and yield for the manufacturer.

A test or verify mode is commercially important in improving back end sort yield and reliability of semiconductor (e.g. logic or memory) devices, such as EPROM 10. In conventional circuit packages, the present test or verify mode is not possible on certain industry standard pin configurations (i.e., the device is pin-limited with respect to control terminals such as the situation where no pin is dedicated to a single control function, such as testing, programming, enabling output or input, etc.) without including or implementing the present invention.

While the invention has been particularly shown and described with reference to the preferred embodiments thereof, various changes and modifications can be made in the invention without departing from the spirit and scope of the present invention, which may be limited only by the appended claims. For example, although many of the control signals were described as being active-low, it should be appreciated that complementary logic employing active-high signal levels is fully within the spirit and scope of this invention. Furthermore, it should be appreciated that other test modes, such as, for example, an erase-verify test mode is also within the spirit and scope of the present invention. Moreover, other types of means for synchronously latching a test mode indicative signal are available, and which would perform the functions recited in the claims. Finally, an EPROM comprising the inventive latch circuit may be one or more of a plurality of memory devices (such as ROMs, EPROMs, E$^2$PROM, FLASH) that collectively define a memory array.

We claim:

1. A circuit in a device comprising:
   means for receiving a first control signal having a first state and a high voltage state, said first state operable as a supply voltage;
   means for receiving a second control signal having recurring transitions between said first state and a second state, said second control signal operable as a clock signal; and,
   means coupled to said first and second receiving means for synchronously latching said high voltage state of said first control signal according to a transition of said second control signal and for generating in response thereto a program verify signal indicative of a program verify mode of the device.

2. The circuit of claim 1 wherein said means for receiving said first signal includes a control terminal.

3. The circuit of claim 2 wherein said control terminal is one selected from the group consisting of programming voltage, output enable, chip enable and program control terminals.

4. The circuit of claim 1 wherein said synchronous latching means includes a master-slave type latch.

5. The circuit of claim 4 wherein said latch is a negative edge triggered d-type latch having a data input terminal responsive to said first control signal, and a clock input responsive to said second control signal, and an output terminal on which said program verify signal is generated.

6. The circuit of claim 1 wherein said device is a memory device.

7. The circuit of claim 6 wherein said memory device is an erasable programmable read only memory (EPROM).

8. The circuit of claim 7 wherein said EPROM is one of a plurality of memory devices defining a memory array.

9. The circuit of claim 1 wherein said means for receiving said first control signal includes a $V_{pp}/\overline{OE}$ control terminal, said means for receiving said second control signal includes a $\overline{CE/PGM}$ control terminal, and said synchronous latching means includes a master-slave type latch, wherein during a first interval when said first control signal assumes a level sufficient to effect programming of the memory device, said second control signal transitions for a predetermined time period from a logic high state to a logic low state for causing said latch to capture said first control signal whereby said test mode signal indicates operation in the test mode, and further, during a second interval when said first control signal assumes a nonprogramming level, said second control signal again transitions from the logic high state to the logic low state for causing said latch to capture said first control signal in the nonprogramming state whereby operation in said test mode is discontinued.

10. The circuit of claim 6, said circuit further including means responsive to said program verify.

11. A circuit in a device comprising:
    a first control terminal for receiving a first control signal having a first state and a high voltage state, said first state operable as a supply voltage;
    a second control terminal for receiving a second control signal having recurring transitions between said first state and a second state; and,
    a latch having a first input configured to receive said first control signal, a second input configured to receive said second control signal, and an output, said latch being configured to latch said high voltage state of said first signal to generate a test mode signal at said output indicative of a test mode of the device in response to a transition of said second control signal.

12. The circuit of claim 11 wherein said circuit further includes an adjusting circuit, responsive to said test mode signal, configured to receive a reference signal and provide a test mode read margin increased relative to a normal operational mode.

13. The circuit of claim 11 wherein said latch comprises a negative-edge triggered d-type latch. signal for adjusting a sense amplifier portion of said memory device so as to provide an increased read margin.

14. The circuit of claim 11 wherein said device is an erasable programmable read only memory (EPROM), and said test mode verifies programming of at least part of said device.

15. The circuit of claim 11 wherein said test mode is a program verify mode, and wherein during a program interval when said first control signal assumes said high voltage state, said second control signal transitions from said first state to said second state for a predetermined time period for causing said latch to capture said first control signal whereby said test mode signal indicates operation in said program verify mode, and further, during a verify interval when said first control signal is at said first state, said second control signal again transitions from said first state to said second state for causing said latch to capture said first control signal at said first state whereby operation in said program verify mode is discontinued in subsequent read intervals.

16. A method for enabling a program verify mode of operation in a device, said method comprising the steps of:
   (A) inputting a first control signal having a first state and a high voltage state to the device, said first state operable as a supply voltage;
   (B) inputting a second control signal having recurring transitions between said first state and a second state to the device operable as a clocking signal; and,
   (C) synchronously latching the first control signal according to a transition of the second control signal and generating in response thereto a program verify mode signal indicating that the device is in the program verify mode of operation.

17. The method of claim 16 wherein the first control signal is input at a first control terminal receiving a programming voltage/an output enable signal, and the second control signal is input at a second control terminal receiving a chip enable/a program control signal.

18. The method of claim 17 wherein step (C) includes the substep of:

capturing the programming voltage/output enable control signal when the programming voltage/output enable control signal assumes a level sufficient to enable programming of or writing to the device, and outputting the program verify mode signal on a low-to-high edge of the chip enable/program control signal.

19. The method of claim 18 further comprising the step of:
   discontinuing the program verify mode signal upon a first low-to-high edge of the chip enable/program control signal after the programming voltage/output enable control signal assumes a logic low state.

20. The method of claim 16 wherein the device is an erasable programmable read only memory (EPROM), said method further comprising the step of:
   adjusting a sense amplifier portion of the EPROM so as to provide a first read margin when said circuit is in said test mode and a second read margin when said circuit is in a normal operational mode, said first read margin being greater than said second read margin.

* * * * *